United States Patent [19]
Chia et al.

[11] Patent Number: 6,054,767
[45] Date of Patent: Apr. 25, 2000

[54] PROGRAMMABLE SUBSTRATE FOR ARRAY-TYPE PACKAGES

[75] Inventors: Chok J. Chia, Cupertino; Seng-Sooi Lim; Patrick Variot, both of San Jose, all of Calif.

[73] Assignee: LSI Logic Corp., Milpitas, Calif.

[21] Appl. No.: 09/006,584

[22] Filed: Jan. 13, 1998

[51] Int. Cl.$^7$ .................................................. H01L 23/48
[52] U.S. Cl. ........................... 257/738; 257/691; 257/701
[58] Field of Search .................................... 257/738, 691, 257/701, 693, 700

[56] References Cited

U.S. PATENT DOCUMENTS

| | | | |
|---|---|---|---|
| 4,688,152 | 8/1987 | Chia | 361/408 |
| 4,778,641 | 10/1988 | Chia | 264/272 |
| 4,972,253 | 11/1990 | Palino et al. | 357/74 |
| 5,400,220 | 3/1995 | Swamy | 361/760 |
| 5,434,750 | 7/1995 | Rostoker et al. | 361/784 |
| 5,435,482 | 7/1995 | Variot et al. | 228/254 |
| 5,563,446 | 10/1996 | Chia et al. | 257/704 |
| 5,594,626 | 1/1997 | Rostoker et al. | 361/784 |
| 5,650,660 | 7/1997 | Barrow | 257/668 |
| 5,763,947 | 6/1998 | Bartley | 257/701 |

*Primary Examiner*—Carl Whitehead, Jr.
*Assistant Examiner*—Roy Potter

[57] ABSTRACT

A programmable substrate and a method of making a programmable substrate for use with array-type packages, including Ball Grid Arrays(BGA), Pin Grid Arrays (PGA) and Column Grid Arrays (CGA) includes a nonconductive programmable substrate with a cavity in the top of the substrate. The cavity is sized to receive an integrated circuit (IC) die. An array of electrically conductive vias pass through the substrate. A plurality of electrical traces are formed on the top of the substrate. The traces extend radially from an edge of the die cavity to the periphery of the substrate so as to pass between and near the vias. Each trace is electrically connected to a pad of the IC die by a wire bond. Each via is connected on a bottom surface of the substrate to a solder ball, pin, or other means for electrically and mechanically attaching the substrate to a printed circuit board. The traces are programmably connected to a selected via, e.g., using wire bonds between the trace and a nearby selected via, thereby allowing each pad of the IC die to be selectively connected to a desired via, and hence to a selected solder ball or pin.

15 Claims, 2 Drawing Sheets

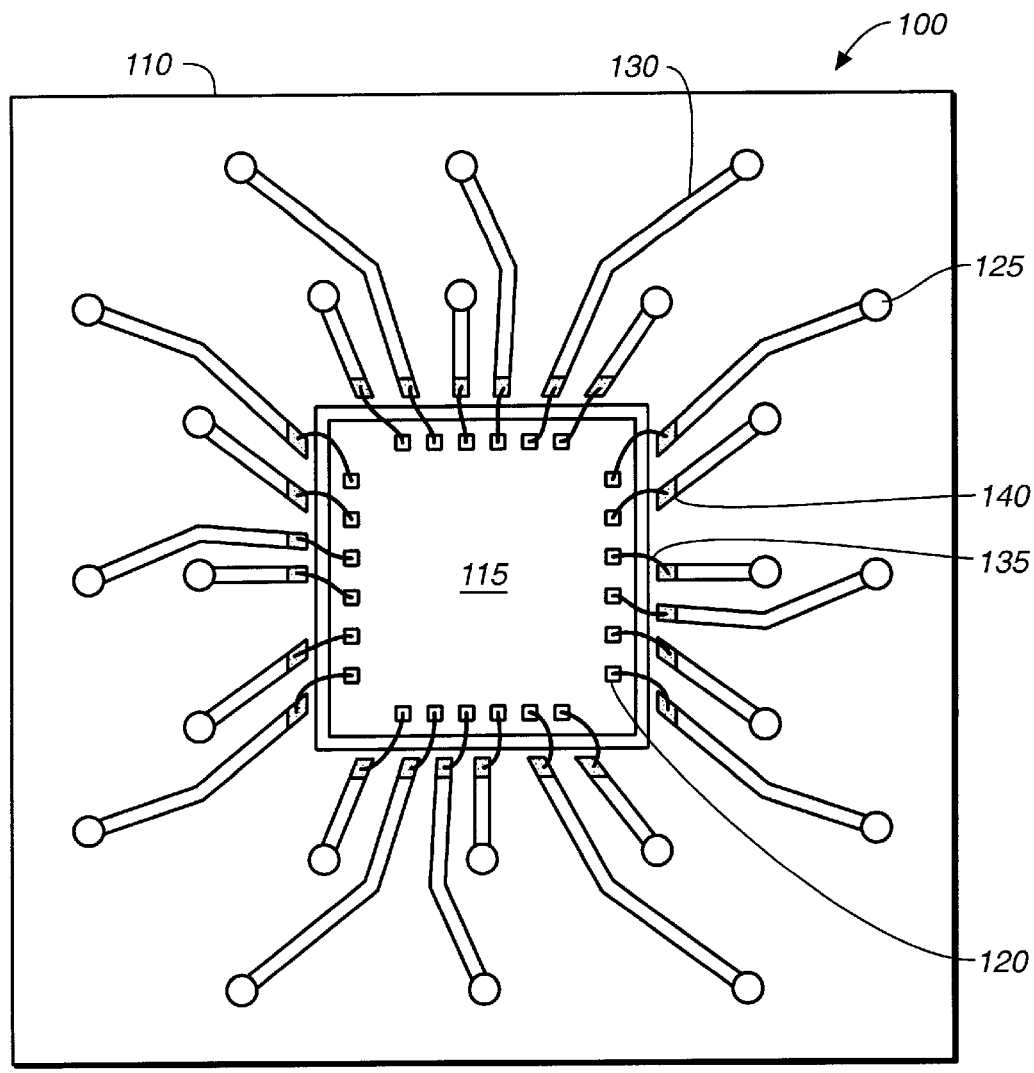
FIG._1
*(PRIOR ART)*
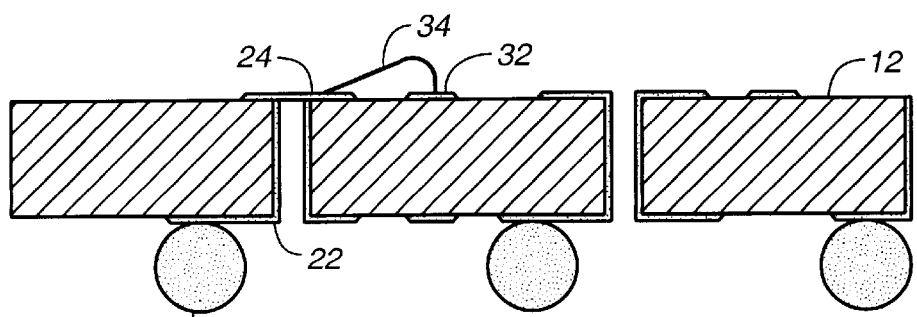
FIG._3

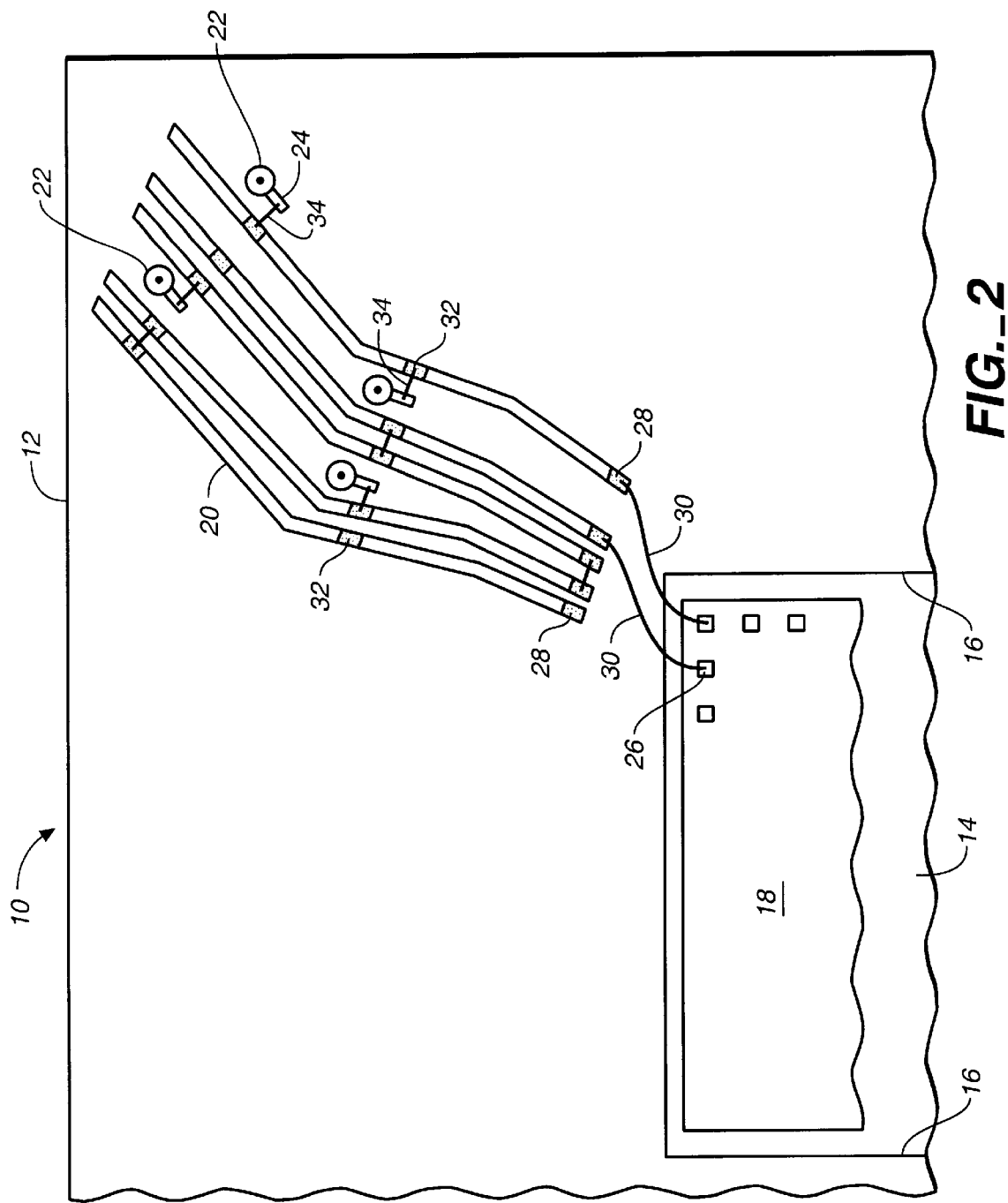
FIG._2

6,054,767

PROGRAMMABLE SUBSTRATE FOR ARRAY-TYPE PACKAGES

BACKGROUND OF THE INVENTION

The present invention relates to integrated circuit packages, and more particularly to a programmable substrate design that is used for array-type packages including Ball Grid Arrays (BGA), Pin Grid Arrays (PGA) and Column Grid Arrays (CGA).

In the last few decades, the electronics industry has literally transformed the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip or IC die, and the more efficient packaging of the IC chip, have played a key role in the success of these products.

The IC chip is not an isolated island. It must communicate with other chips in a circuit through an Input/Output (I/O) system of interconnects. Moreover, the IC chip and its embedded circuitry are delicate, and must therefore be protected in a package that can both carry and protect it. As a result, the major functions of the IC package are: (1) to provide a path for the electrical current that powers the circuits on the chip; (2) to distribute the signals on to and off of the chip; (3) to remove the heat generated by the circuit; and (4) to support and protect the chip from hostile environments.

Integrated circuits are typically housed within a package that is mounted to a printed circuit board (PCB). The package has conductive leads or pins that are soldered to the PCB and coupled to the integrated circuit by a lead frame. In array type packages, the substrate is designed with predetermined interconnections between the bond pad of the IC die or IC chip and the array connection, either a ball, pin or column. The substrates are generally ceramic or plastic based. The circuitry for the connection between the pad and ball are formed by photo etching for plastic laminate base material or screened-on conductive material for ceramic based materials.

FIG. 1 shows the prior art structure of an integrated circuit (IC) 100. The IC 100 is made from a base substrate 110 that includes a central or inner section on the top surface wherein an integrated circuit (IC) die 115 is located. The IC die 115 is secured to the base substrate 110. Around the periphery of the IC die 115 are IC contact pads 120.

Located within the base substrate 110 are a spaced array of metallically line vias 125. As is known in the art, a via is made by drilling a hole through the substrate and then plating or lining the hole with a conductive material such as copper, gold or silver. Located on the top surface of the base substrate 110 are a plurality of conductive traces 130. The traces 130 extend radially out from the IC die 115 and the termination of each trace 130 is to an individual via 125. The inner end of each trace 130 is a bonding pad 140, near the IC die 115. The bonding pad 140 is electrically joined to the contact pads 120 with bonding wires 135. On the bottom surface of the base substrate 110, the via 125 may be connected to solder balls to form a Ball Grid Array (BGA) package, or connected to pins to form a Pin Grid Array (PGA) package, or connected to columns to form a Column Grid Array (CGA) package.

Each device manufacturer typically has preferred integrated circuit designs. In current practice, the substrate is typically optimized for a particular integrated circuit design, with the appropriate die-to-ball, die-to-pin or die-to-column connections (hereafter "pad-to-pint" connections) being included in the design for the best performance of the device. The substrate has to be designed, tooled and manufactured before the IC die can be packaged. Additionally, each new IC requirement mandates a new substrate design and tooling to manufacture.

After the substrate is designed, changes cannot be made without re-designing and re-tooling. This generally takes weeks. The IC die designer can use existing substrates, but since the pad-to-pin connection is set, the IC die function may not be optimum. A fixed substrate design does not allow the IC die designer to evaluate the different options for optimized performance without going to multiple designs and long fabrication cycle times. Moreover, any errors in the design require retooling of the substrate to correct.

In certain situations, there is a need to connect a certain pad on the IC die to a particular array location. For example, a specific pad-to-pin connection may be needed to improve the performance of the device. Unfortunately, a specific pad-to-pin connection typically means a custom design of the substrate, which is costly and takes time to implement.

While it is known in the art for an assembly manufacturer to service different customers with different IC die connections, this requires that the manufacturer design and stock different substrates for each of the different IC dies that are to be used by its customers. Disadvantageously, such multi-substrate-design and stocking can be expensive.

In view of the above, it is evident that what is needed is a substrate that can be programmed or easily reused or modified by the assembly manufacturer so as to allow pad-to-pin connections to be modified to facilitate different IC die connections, reduce the fabrication cycle time for new designs and to thereby make the design and implementations of different IC packages more cost effective.

SUMMARY OF THE INVENTION

The present invention addresses the above and other needs by providing a programmable substrate for array-type packages and a method of making the programmable substrate that improves the compatibility of the substrate with a wide variety of integrated circuit dies. Advantageously, such programmable substrate and method dramatically reduces the time to develop and market custom IC package designs.

While prior art substrates have traces that start from the IC die and end at the via, the present invention provides traces that also start at the IC die but go past the via, and in fact go past several vias, all the way to the perimeter of the substrate. The present invention allows the traces to be connected to any one of the nearby vias, while the prior art teaches that each trace must be connected to a particular via, thus fixing the design.

The programmable substrate described herein can be used with many kinds of array type packages, including Ball Grid Array (BGA) packages, Pin Grid Array (PGA) packages and Column Grid Array (CGA) packages. Basically, the programmable substrate of the present invention includes a nonconductive programmable substrate having a cavity therein (or a surface thereon) sized to receive an integrated circuit die. An array of electrically conductive vias pass through the substrate to make contact with each pin, ball, or column on the bottom of the package. A plurality of electrical traces on the top of the substrate extend from an edge of the cavity to the periphery of the substrate, passing between and near the vias. Each trace is connected at its edge-of-cavity end to a pad on the die using conventional wire-bonding techniques. Each trace may then also be selectively connected to a desired pin, ball, or column by connecting a wire bond between the via corresponding to the desired pin, ball, or column and the trace as the trace passes near the via. Thus, by selectively connecting the traces to vias corresponding to desired pins, balls, or columns, the pad-to-pin connections of the IC package may be programmed.

BRIEF DESCRIPTION OF THE DRAWINGS

The above and other aspects, features and advantages of the present invention will be more apparent from the following more particular description thereof, presented in conjunction with the following drawings wherein:

FIG. 1 is a plan view showing an integrated circuit array package of the prior art;

FIG. 2 is a plan view of the present invention showing a portion of the top of an integrated circuit package with programmable substrate for array-type packages; and FIG. 3 is a cross-sectional view of FIG. 2, showing the present invention as used with a Ball Grid Array (BGA) package.

Below is a list of reference numbers associated with the figures.

No. Component
10 Integrated Circuit
12 Programmable Substrate
14 Cavity
16 Cavity Walls
18 Integrated Circuit Die
20 Trace
22 Via Connector
24 Via Bond Pad
26 IC Die Contact Pad
28 Bonding Pad
30 Bonding Wire
32 Trace Bond Pad
34 Via Bond wire
36 Solder Ball
100 Integrated Circuit (Prior Art)
110 Base Substrate
115 Integrated Circuit Die
120 IC Contact Pads
125 Via
130 Trace (Prior Art)
135 Bonding Wire
140 Bonding Pad

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

FIG. 1 illustrates a prior art device and has been described in the background of the invention.

FIG. 2 shows a portion of a plan view of an integrated circuit 10 made in accordance with the invention. The integrated circuit 10 is made from a programmable substrate 12 that includes a central or inner section wherein an integrated circuit (IC) die 18 is mounted. Typically, this section is of reduced thickness, defined by cavity walls 16, thereby forming a cavity 14 in which the IC die 18 may be located.

On the surface of the IC die 18, typically around an outer edge of the die 18, are IC contact pads 26. It is through these IC contact pads 26 that electrical contact is made with the IC. Thus, the pins, balls, or columns of the integrated circuit 10 must ultimately be electrically connected to these IC contact pads 26 in order for the IC to perform its intended function. Advantageously, the present invention allows different ones of the pins, balls, or columns of the integrated circuit 10 to be programmably connected to different ones of the IC contact pads 26.

The programmable substrate 12 is made from a nonconductive material such as a ceramic or plastic material, for example: Kapton, polyimide or PVC. The integrated circuit die 18 is secured to the center section of the programmable substrate 12, e.g., within the cavity 14, by cement or other suitable means of physical attachment.

Located within the programmable substrate 12 is a spaced array of metallically lined vias 22. As known in the art, a via is made by drilling a hole through the substrate and then plating or lining the hole with a conductive material, such as copper, gold or silver. Attached to each of the vias 22 on the top surface of the programmable substrate 12 is a via bond pad 24. The via 22 and its respective via bond pad 24 are made of conductive material such as copper, copper plated with gold or silver. On the lower surface of the programmable substrate 12, the via 22 may be attached to many different connections, for example the via 22 may be connected to solder balls located on the bottom surface of the programmable substrate 12 to form a Ball Grid Array (BGA), or connected to pins to form a Pin Grid Array (PGA), or connected to columns to form a Column Grid Array (CGA).

Located on the top surface of the programmable substrate 12 are a plurality of conductive traces 20. The traces 20 are also made from conductive material such as copper, copper plated with gold or silver. The traces 20 extend radially out from the cavity 14 to the outer edge of the programmable substrate 12. The traces 20 are routed between and near the vias 22. At the inner end of each of the traces 20, near the cavity 14, are bonding pads 28. Each of the bonding pads 28 are connected to a specific IC contact pad 26 with a bonding wire 30. Along the traces 20, near the point where the trace passes near a via bond pad 24, are exposed sections of the traces 20 which are plated for use as trace bond pads 32. The trace bond pads 32 may then be selectively connected to a desired via bond pad 24 with a bond wire 34. Advantageously, by connecting a desired via bond pad 22 with a selected trace bond pad 32, the IC connections of the resulting IC package may be programmed. That is, by merely controlling which via bond pad 24 is wire bonded to which trace bond pad 32, the "pin-to-pad" connections of the IC may be programmably altered.

FIG. 3 shows a cross-sectional view of FIG. 2 through one of the vias 22. The example of FIG. 3 shows a Ball Grid Array (BGA) package, but is also applicable to other arrays. The via 22 extends through the programmable substrate 12 to electrically connect the upper surface to the lower surface. The top of the via 22 is electrically connected to the via bond pad 24, and the via bond pad 24 is connected to the trace bond pad 32 using the via bond wire 34. The lower part of the via 22 is connected to a conductive solder ball 36. The solder ball 36, is arranged in a ball grid array, as is known in the art, and such array is adapted for connection to a printed circuit board (PCB) (not shown). The soldering of the solder ball 36 to the PCB is performed in conventional manner, e.g., through a solder reflow operation, and mechanically attaches the IC to the PCB. Using pins in a Pin Grid Array (PGA) package or columns in a Column Grid Array (CGA) package instead of solder balls will also mechanically attach the IC to the PCB.

In practice, a filler material (not shown), e.g., epoxy or other suitable protective material or encapsulant, may be placed over the IC die 18 in order to fill in voids and cover the IC die 18 and wire bonds 30 to help protect them. Thus, in this or an equivalent manner, the IC die 18 is encapsulated with encapsulant after all the connections are made from the IC die 18 to the solder balls 36.

The number and arrangement of the traces 20 and the vias 22 shown in FIG. 2 is meant to teach the concept of an integrated circuit 10, but is not necessarily meant to show the actual number and arrangement of the traces and vias that may be used in an IC package. A typical BGA package may have outer dimensions of 15 mm by 15 mm, up to 50 mm by 50 mm, with an array of 11 by 11 up to 49 by 49 solder balls on its lower surface for attachment to a PCB. The solder balls may be arranged in a suitable pattern or array so that they align with and may be soldered to appropriate locations on the PCB, thereby providing both electrical and mechanical attachment of the integrated circuit 10 to the PCB.

Advantageously, use of the present invention by the assembly manufacturer allows custom integrated circuit (IC) designs to be made for each IC, with special features (e.g., specific pad-to-pin connections) being programmed at the assembly manufacturer. Minimal tooling cost or lead-time is required for each specific design. From a net list of preferred pad-to-pin connections, the assembly manufacturer simply programs in the connections to be made per the customer's requirement. The net list is a listing of the preferred connection between the selected IC die and solder ball, pin or column. From the net list, the assembly manufacturer can program which trace is connected to which via. Such connections may then be realized using automated wire-bonding equipment as in known in the art.

An example of a net list is shown below. On the right is a sample grid-array and the left is a table of the preferred connections

|   | A | B | C |
|---|---|---|---|
| 1 | • | • | • |
| 2 | • | • | • |
| 3 | • | • | • | between the IC die pad and the ball/pin connections. In this example there are 9 possible connections.

| IC DIE PAD # | PREFERRED BALL/PIN CONNECTION | ALTERNATE BALL/PIN CONNECTION |
|---|---|---|
| 1 | A1 | A1 |
| 2 | A2 | B1 |
| 3 | A3 | C1 |
| 4 | B1 | A2 |
| 5 | B2 | B2 |
| 6 | B3 | C2 |
| 7 | C1 | A3 |
| 8 | C2 | B3 |
| 9 | C3 | C3 |

Programmable substrates made in accordance with the invention may be stocked by the IC assembly manufacturer for instant availability, thereby allowing the manufacturer to tailor the substrate and the device for optimum electrical performance. The availability of programmable substrates which are programmed at the IC assembly factory greatly reduces the time to market a custom design. Moreover, the ability to program the pad-to-pin connections facilitates debugging the device design, and allows for changes to be made to improve the design with a fast turn-around time.

While the invention herein disclosed has been described by means of specific embodiments and applications thereof, numerous modifications and variations could be made thereto by those skilled in the art without departing from the scope of the invention set forth in the claims.

What is claimed is:

1. An integrated circuit (IC) with programmable substrate comprising:
   (a) an IC die having a plurality of contact pads;
   (b) a programmable substrate, the substrate having a periphery, a top, a bottom and an IC mounting area, the IC die being mounted to the IC mounting area;
   (c) a plurality of electrically conductive vias passing between the top and the bottom of the substrate;
   (d) a plurality of electrical traces formed on the top of the substrate, the electrical traces extending from the IC mounting area to the periphery of the substrate, the electrical traces being electrically connected to the contact pads of the IC die;
   (e) means for selectively electrically connecting each electrical trace to one of a plurality of different vias, whereby the contact pads of the IC die may be selectively electrically connected to different ones of the vias; and
   (f) means for electrically and mechanically connecting the vias on the bottom of the substrate to a printed circuit board.

2. The integrated circuit of claim 1 wherein the means for selectively electrically connecting the electrical traces to the vias comprises means for connecting wire bonds between the selected electrical traces and the selected vias using a net list that identifies desired trace-to-via connections for a given IC die.

3. The integrated circuit of claim 1 wherein the means for electrically and mechanically connecting the IC to the printed circuit board comprises an array of solder balls, each solder ball being connected to a respective via on the bottom of the substrate.

4. The integrated circuit of claim 1 wherein the means for electrically and mechanically connecting the IC to the printed circuit board comprises an array of columns, each column being connected to a respective via on the bottom of the substrate.

5. The integrated circuit of claim 1 wherein the means for electrically and mechanically connecting the IC to the printed circuit board comprises an array of pins, each pin being connected to a respective via on the bottom of the substrate.

6. A programmable substrate for array-type integrated circuit (IC) packages comprising:
(a) a nonconductive substrate, the substrate having a periphery, a top and a bottom, and a mounting area in the top of the substrate, the mounting area being sized to receive an IC die;
(b) an array of electrically conductive vias passing transversely through the substrate;
(c) a plurality of electrical traces on the top of the substrate, the electrical traces extending generally radially from an edge of the mounting area to the periphery of the substrate so as to pass between the vias; and
(d) a programmable means for electrically connecting each electrical trace to a selected via of the array of vias for a chosen IC die.

7. The programmable substrate of claim 6 wherein the programmable means comprises means for electrically connecting each of the traces to a selected via using a net list that identifies a desired trace-to-via connection for the chosen IC die.

8. A ball grid array (BGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling solder balls on a second surface of the programmable substrate to selected ones of the conductive traces on the first surface of the programmable substrate;
wherein the means for electrically connecting the contact pads to the conductive traces comprises a wire bond.

9. A ball grid array (BGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling solder balls on a second surface of the programmable substrate to selected ones of the conductive traces on the first surface of the programmable substrate;
wherein the means for programmably coupling solder balls to selected conductive traces comprises means for connecting each conductive trace to one of an array of solder balls, each solder ball being connected to a conductive via, by selectively connecting the conductive trace to a selected conductive via.

10. A pin grid array (PGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling pins on a second surface of the programmable substrate to selected ones of the conductive traces on the first surface of the programmable substrate.

11. A ball grid array (BGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling solder balls on a second surface of the programmable substrate to selected ones of the conductive traces on the first surface of the programmable substrate;
wherein the means for electrically connecting the contact pads to the conductive traces comprises a wire bond.

12. A ball grid array (BGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling solder balls on a second surface of the programmable substrate to selected ones of the conductive traces on the first surface of the programmable substrate;
wherein the means for programmably coupling pins to selected conductive traces comprises means for connecting each conductive trace to one of an array of pins, each pin being connected to a conductive via, by selectively connecting the conductive trace to a selected conductive via.

13. A column grid array (CGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling columns on a second surface of the programmable substrate to selected ones of the conductive traces on the first surface of the programmable substrate.

14. A ball grid array (BGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling solder balls on a second surface of the programmable substrate to selected ones of the conductive traces on the first surface of the programmable substrate;
wherein the means for electrically connecting the contact pads to the conductive traces comprises a wire bond.

15. A ball grid array (BGA) integrated circuit (IC) package with a programmable substrate for housing an integrated circuit (IC) die, said IC die having contact pads thereon, comprising:
(a) means for electrically connecting the contact pads of the IC die to conductive traces on a first surface of a programmable substrate; and
(b) means for programmably coupling solder balls on a second surface of the programmable substrate to selected ones of the conductive traces on the first surface of the programmable substrate;

wherein the means for programmably coupling columns to selected conductive traces comprises means for connecting each conductive trace to one of an array of columns, each column being connected to a conductive via, by selectively connecting the conductive trace to a selected conductive via.

* * * * *